(12) United States Patent
White et al.

(10) Patent No.: US 7,571,893 B2
(45) Date of Patent: Aug. 11, 2009

(54) VALVE WITH HIGH TEMPERATURE RATING

(75) Inventors: Carl L. White, Gilbert, AZ (US); Paul G. Curry, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 308 days.

(21) Appl. No.: 11/560,771

(22) Filed: Nov. 16, 2006

(65) Prior Publication Data
US 2008/0116411 A1    May 22, 2008

(51) Int. Cl.
*F16K 1/42* (2006.01)
(52) U.S. Cl. .............. 251/362; 251/361; 251/331; 251/61.1
(58) Field of Classification Search ........... 251/61.1, 251/331, 359, 360, 361, 362
See application file for complete search history.

(56) References Cited

U.S. PATENT DOCUMENTS

| | | | | |
|---|---|---|---|---|
| 3,822,680 A | * | 7/1974 | Showalter et al. | 123/41.16 |
| 4,236,495 A | * | 12/1980 | Rosan, Jr. | 123/188.8 |
| 4,676,482 A | * | 6/1987 | Reece et al. | 251/365 |
| 5,215,286 A | * | 6/1993 | Kolenc | 251/58 |
| 5,657,786 A | | 8/1997 | DuRoss et al. | |
| 5,769,952 A | * | 6/1998 | Komino | 118/733 |
| 2001/0054377 A1 | | 12/2001 | Lindfors et al. | |
| 2004/0216667 A1 | | 11/2004 | Mitsuhashi et al. | |
| 2006/0156981 A1 | | 7/2006 | Fondurulia et al. | |
| 2007/0128877 A1 | | 6/2007 | White | |

FOREIGN PATENT DOCUMENTS

| | | |
|---|---|---|
| BE | 01 015 922 A3 | 11/2005 |
| FR | 01 227 692 A | 8/1960 |
| FR | 2385016 A | 2/1976 |
| JP | 08-60374 A | 3/1996 |
| JP | 08-189574 A | 7/1996 |

OTHER PUBLICATIONS

International Search Report and Written Opinion of the International Searching Authority dated Jan. 23, 2008, in counterpart International Patent Application No. PCT/US2007/079335.

* cited by examiner

*Primary Examiner*—John K Fristoe, Jr.
(74) *Attorney, Agent, or Firm*—Knobbe, Martens, Olson & Bear LLP

(57) ABSTRACT

A valve comprises a valve seat and a movable diaphragm. The valve seat defines a fluid orifice and is formed at least partially of polybenzimidazole. The diaphragm is sized and configured to bear against the fluid orifice to substantially block fluid flow through the orifice. The valve is advantageously used in a hot zone of a semiconductor processing system.

3 Claims, 3 Drawing Sheets

VALVE WITH HIGH TEMPERATURE RATING

BACKGROUND OF THE INVENTION

1. Field of the Invention

The present invention relates generally to valves for use in high temperature zones, and specifically to valves used in semiconductor equipment for controlling gas flow at high temperatures.

2. Description of the Related Art

High-temperature ovens, called reactors, are used to create structures of very fine dimensions, such as integrated circuits on semiconductor substrates. One or more substrates, such as silicon wafers, are placed on a substrate support inside the reaction chamber. Both the substrate and support are heated to a desired temperature. In a typical substrate treatment step, reactant gases (also referred to as precursors) are passed over the heated substrate, causing the deposition (e.g., chemical vapor deposition, or CVD) of a thin layer on the substrate. CVD is typically conducted at high temperatures, such as 250-900° C.

Deposition equipment normally includes a system for delivering gas to the reaction chamber. The gas delivery system typically comprises a plurality of precursor sources, at least one carrier gas source, a network of pipes for delivering the precursor gases to the reaction chamber, an injection manifold or showerhead for injecting the gas into the chamber, and a number of valves for controlling the gas flow. Also, some precursor sources may be in powder or liquid form, and means for vaporizing such precursors can be provided (e.g., bubblers).

One type of CVD is atomic layer deposition (ALD). In ALD, two complementary precursors are alternatively introduced into the reaction chamber. Typically, a first precursor will adsorb onto the substrate surface, but it cannot completely decompose without the second precursor. The first precursor adsorbs until it saturates the substrate surface; further growth cannot occur until the second precursor is introduced. Thus, the film thickness is controlled by the number of precursor injection cycles rather than the deposition time, as is the case for conventional CVD processes. Accordingly, ALD allows for extremely precise control of film thickness and uniformity. ALD is also conducted at high temperatures, such as 250-900° C.

In ALD, the reaction chamber is typically pulsed with a non-reactive protective gas between injections of the two precursor gases, in an attempt to rid the chamber of any excess of the preceding precursor gas. Otherwise, the excess preceding precursor would intermix and react with the subsequently pulsed precursor to form unwanted CVD-type growth on the substrate surface and/or on surfaces of the chamber.

Also, condensation of the precursors should be avoided in the vicinity of the reaction chamber. Condensation of the precursors, in particular in the conduits between the precursor sources and the reaction chamber as well as on the substrate, will seriously impair the quality of the thin film. The same applies to condensation of solid particles or liquid droplets on the thin film in the reaction chamber. Therefore, an ALD process is operated in such a manner that the temperature in the equipment interconnecting the precursor sources and the outlet of the reaction chamber (the "hot zone") is not allowed to drop below the highest of the condensation temperatures of the precursors. The temperature of the ALD process is determined by the precursors used and the applied pressure. Generally, the temperature lies in the range between the condensation/evaporation temperature and the decomposition temperature of the precursors.

Polybenzimidazole (PBI) is a high performance polymer with a wholly aromatic molecule of high thermal stability. PBI items are typically made by a powder sintering processes. PBI has excellent high temperature properties (e.g., thermal resistance) and is generally nonflammable, strong, stiff, wear-resistant, plasma-resistant (including oxide etch plasma), and very hard. It has a particularly high strength in and recovery from compression, and a coefficient of thermal expansion of about $23 \times 10^{-6}$, which is similar to that of aluminium. Compared to other high performance polymers, PBI displays good chemical resistance to many harsh chemical environments. Despite absorbing (slowly) a high percentage of water at saturation, PBI is stable to hydrolysis and resists high-pressure steam. It also has a low coefficient of friction (e.g., 0.19-0.27). One type of PBI material is Celazole®, which is a trademark of PBI Performance Products, Inc. of Charlotte, N.C., U.S.A. and commercially available from Quadrant Engineering Plastic Products of Reading, Pa., U.S.A.

SUMMARY OF THE INVENTION

It is a principle object and advantage of the present invention to provide an improved valve for regulating fluids at high temperatures, particularly for use in semiconductor processing equipment.

In one aspect, the invention provides a valve comprising a valve seat and a movable diaphragm. The valve seat defines a fluid orifice and is formed at least partially of polybenzimidazole. The diaphragm is sized and configured to bear against the fluid orifice to substantially block fluid flow through the orifice.

In another aspect, the invention provides a valve seat comprising a seat body defining a fluid orifice, the seat body being formed at least partially of polybenzimidazole.

In yet another aspect, the invention provides a semiconductor processing system comprising a substrate processing chamber, a gas delivery system for delivering process gases to the processing chamber, and at least one valve configured to regulate flow of the process gases from the gas delivery system. The valve comprises a valve seat and a movable diaphragm. The valve seat defines a fluid orifice and is at least partially formed of polybenzimidazole. The diaphragm is sized and configured to bear against the fluid orifice to substantially block fluid flow through the orifice.

In yet another aspect, the invention provides a valve at least partially formed of polybenzimidazole.

In still another aspect, the invention provides a method of delivering a process gas to a substrate reaction chamber. The method comprises providing a substrate reaction chamber, providing a valve at least partially formed of polybenzimidazole, and delivering a process gas through the valve to the reaction chamber.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

DETAILED DESCRIPTION OF THE PREFERRED EMBODIMENT

One limitation of conventional deposition equipment is that the valves of the gas delivery system must be positioned at a certain distance from the "hot zone" of the reaction chamber. The hot zone generally comprises the reaction chamber and a surrounding area that is kept at a relatively high temperature. Conventional valves would degrade or possibly even melt if positioned in the hot zone. Thus, the valves are normally positioned at a safe distance upstream of the reaction chamber, to enhance their longevity.

This limitation on the positioning of the valves of the reactant gas delivery system can lead to a significant problem. For example, during ALD, it is desirable to completely shut off the inflow of a first precursor while a second precursor is being injected into the reaction chamber, to avoid premature intermixing and CVD-type growth. However, since the valves are significantly upstream of the injection manifold or showerhead, some of the first precursor still resides within its injection conduit downstream of an associated valve after the valve is closed. Even after the reaction chamber is pulsed with a sweep gas between alternating injections of first and second precursor gases, some of the first precursor gas downstream of the valve has been observed to slowly flow into the reaction chamber while the second precursor gas is injected into the chamber.

Figure 1:
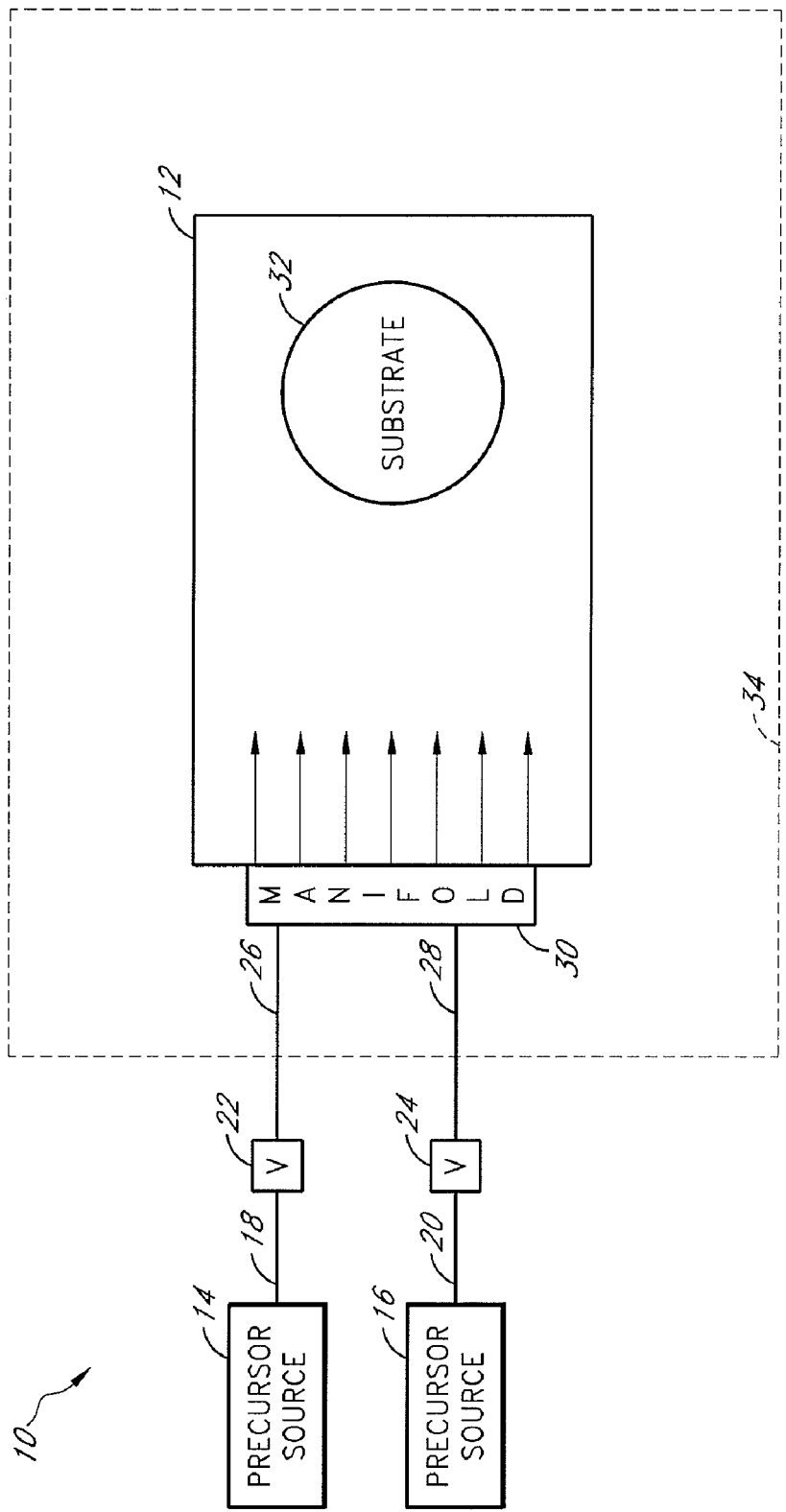
FIG. 1 is a schematic view of a conventional semiconductor reaction chamber and an associated gas delivery system.

For example, consider FIG. 1, which is a schematic illustration of a conventional gas delivery system 10 for a reaction chamber 12. The delivery system 10 includes a plurality of precursor sources, of which only two sources 14 and 16 are shown. The delivery system 10 also includes gas conduits 18 and 20, valves 22 and 24, gas conduits 26 and 28, and an injection manifold 30. Although not shown, it will be understood that additional elements of the gas delivery system 10 may be provided, including bubblers for liquid reactant sources, carrier gas sources, non-reactive sweep gas sources, pumps, and the like. The valve 22 is downstream of the gas conduit 18 and upstream of the gas conduit 26. Similarly, the valve 24 is downstream of the gas conduit 20 and upstream of the gas conduit 28.

In the illustrated apparatus, the injection manifold 30 receives precursor gases from the gas conduits 26 and 28 and injects the gas horizontally toward a substrate 32 inside the reaction chamber 12. In other types of apparatuses, the process gases are injected differently. For example, showerhead injectors inject the process gases downward from above the substrate. In CVD, two different precursor gases are injected simultaneously toward the substrate 32 for growth thereon at an appropriate temperature. In ALD, the precursors are pulsed separately as described above. Although not shown, the reaction chamber 12 includes one or more outlet ports downstream of the substrate 32.

A "hot zone" 34 is represented by a dotted line surrounding the reaction chamber 12. In the illustrated conventional apparatus, the valves 22 and 24 are positioned outside of the hot zone 34 in order to prevent the valves from degrading at a high rate or possibly even melting at high temperatures. This arrangement can lead to undesirable mixing of precursor gases in ALD processing. For example, suppose a precursor gas from the source 14 is first pulsed into the chamber 12 to saturate the surface of the substrate 32. In this step, the valve 22 is open to allow for the precursor gas flow through the conduit 26 into the chamber 12, while the valve 24 is closed. After the substrate surface is saturated with the first precursor, the valve 22 is closed and the chamber 12 is pulsed with a non-reactive sweep gas to remove an excess of the first precursor gas from the chamber. However, some of the first precursor gas may still remain in the gas conduit 26 and the manifold 30. Next, the valve 24 is opened and a precursor gas from the source 16 is injected through the conduit 28 into the chamber 12. During this time, it may not be possible to stop the first precursor gas in the conduit 26 from slowly flowing into the manifold 30 and chamber 12, and mixing and reacting with the second precursor gas to produce undesired CVD-type growth on the substrate 22 and/or other surfaces of the chamber 12. This phenomenon can defeat the very purpose of ALD processing—to tightly control the growth rate of a film one monolayer at a time. This phenomenon can also prevent uniform deposition of films onto the substrate 22.

Some valve manufacturers have produced valves with valve seats formed of somewhat high performance polymers. For example, Swagelok Company of Solon, Ohio produces a high cycle life (10-25 million open/close cycles) valve that can be used in ALD processes up to a maximum of 200° C. That particular valve uses a valve seat formed of PFA (perfluoroalkoxy). Valve manufacturers have also formed valve seats out of materials such as PEEK® (a trademark of Victrex PLC) and Kel-F (polychlorotrifluoroethylene, or PCTFE). However, these valves do not have high longevity (e.g., more than one million open/close cycles) at temperatures of 250° C. or higher.

Some gas delivery systems have attempted to avoid this problem by replacing the mechanical valves that regulate the pulsing of the precursors with gas flow barriers formed by inert or inactive gas in the conduit interconnecting the precursor source with the reaction chamber. For example, see U.S. Pat. No. 6,783,590 to Lindfors et al. While these apparatuses provide an excellent alternative to the use of degradable valves, they unfortunately require additional piping and special, somewhat complex operating procedures.

Figure 2:
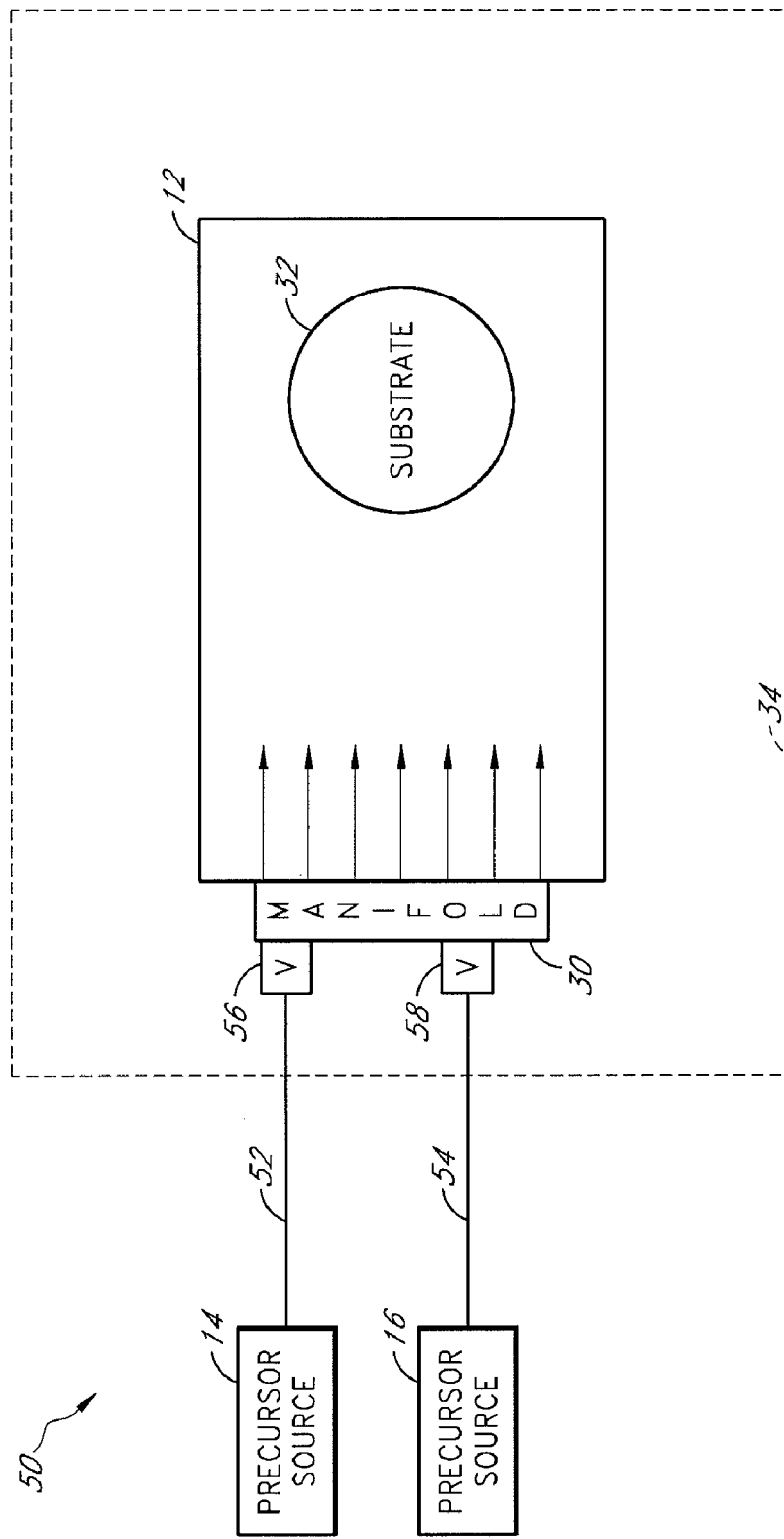
FIG. 2 is a schematic view of a semiconductor reaction chamber and an associated gas delivery system utilizing high temperature valves according to an embodiment of the present invention.

The present invention substantially solves the aforementioned problem by providing valves that are capable of long use (e.g., more than one million open/close cycles before degrading) within a hot zone at a temperature of 250° C. or higher. FIG. 2 illustrates an embodiment of a gas delivery system 50 with such improved valves. Aside from the valves, all of the elements of FIG. 2 can be substantially the same as in FIG. 1. Accordingly, like reference numerals are used in FIG. 2. The illustrated gas delivery system 50 includes precursor sources 14 and 16 and an injection manifold 30 as described above with respect to FIG. 1. In addition, the gas delivery system 50 includes gas conduits 52 and 54 extending from the precursor sources, and high temperature valves 56 and 58 connected to ends of the conduits 52 and 54, respectively, and immediately upstream of the manifold 30. The valves 56 and 58 are preferably positioned as close to the manifold 30 as possible, but need not be immediately upstream of the manifold 30 as shown. Advantageously, the valves 56 and 58 are in the hot zone 34 and are capable of withstanding the high temperatures thereof.

This arrangement substantially overcomes the aforementioned problem of intermixing of the precursor gases. For example, in ALD processing, suppose a precursor gas from the source 14 is first pulsed into the chamber 12 to saturate the surface of the substrate 32. In this step, the valve 56 is open to allow for the precursor gas flow through the conduit 52 into the chamber 12, while the valve 58 is closed. After the substrate surface is saturated with the first precursor, the valve 56 is closed and the chamber 12 is pulsed with a non-reactive sweep gas to remove an excess of the first precursor gas from the chamber. Since the valve 56 is immediately upstream of the manifold 30, very little or none of the first precursor remains in the gas delivery system downstream of the valve 56 after the valve 56 is closed. Next, the valve 58 is opened and a precursor gas from the source 16 is injected through the conduit 54 into the chamber 12. Advantageously, the risk of premature mixing of the second precursor with residual amounts of the first precursor downstream of the valve 56 is substantially eliminated, thereby overcoming the above-described problem of undesired CVD-type growth on the substrate 22 and/or other surfaces of the chamber 12.

Preferably, the high temperature valves 56 and 58 (and any other valves that may be positioned in the hot zone 34) are formed at least partially of polybenzimidazole (PBI), and preferably Celazole® PBI.

Figure 3:
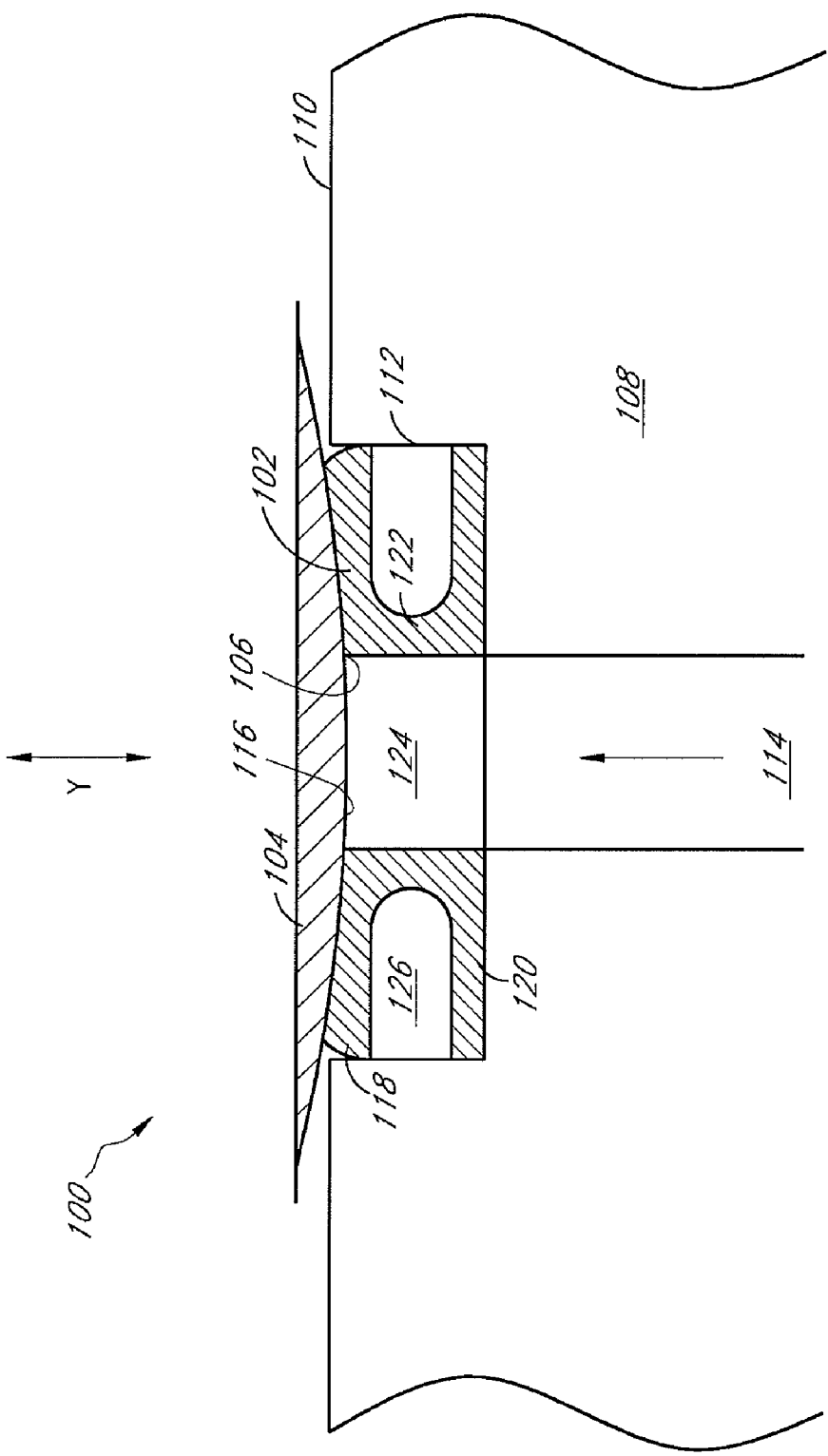
FIG. 3 is a cross-sectional view of a valve according to one embodiment of the present invention.

FIG. 3 shows an embodiment of a high temperature valve that can be used in semiconductor processing equipment. The valve 100 comprises a valve seat 102 and a movable diaphragm 104. The valve seat 102 defines a fluid orifice 106 through which a fluid may flow. The valve seat 102 is preferably formed at least partially, and more preferably substantially completely, of PBI. The orifice 106 is preferably substantially circular.

The diaphragm 104 is preferably sized and configured to bear against the fluid orifice 106 to substantially block fluid flow through the orifice 106 of the valve seat 102. As used herein, a "diaphragm" should be construed broadly to refer to any of a wide variety of members of various shapes and sizes for blocking fluid flow through an orifice. The illustrated diaphragm 104 is preferably movable along a direction Y to selectively block fluid flow through the orifice 106. Accordingly, the diaphragm 104 is preferably movable between the position shown (in which fluid flow through the orifice 106 is substantially blocked) and a position at least slightly distanced from the valve seat 102 (in which fluid flow through the orifice 106 is substantially permitted). The diaphragm 104 preferably has a bearing surface 116 that bears against the fluid orifice 106 to substantially block fluid flow through the orifice 106. The illustrated bearing surface 116 is convex with respect to the orifice 106, which in this embodiment is substantially circular. The diameter of the diaphragm 104 is preferably larger than that of a circular valve seat 102, so that the contact between the top of the seat 102 is closer to the center of the diaphragm.

The illustrated valve seat 102 comprises two cylindrical disk-shaped portions 118 and 120 that sandwich a cylindrical central portion 122. The disk-shaped portions 118 and 120 preferably have a larger diameter and a smaller height than the central portion 122, such that an annular gap 126 is formed. The illustrated valve seat 102 also has a fluid channel 124 extending through the disk-shaped portions 118, 120 and the central portion 122, the fluid orifice 106 comprising an end of the fluid channel 124. One or both of the disk-shaped portions 118 and 120 are preferably configured to flex to produce an improved seal when the diaphragm 104 is pressed against the orifice 106. It will be understood that the valve seat and diaphragm can have alternative configurations that induce seat flexure to produce a better seal (i.e., more surface area of contact between the valve seat and the diaphragm).

The illustrated valve seat 102 is positioned within a body 108 having a surface 110 with a recess 112 sized to closely receive the valve seat 102. The body 108 has a fluid passage 114 extending to the recess 112 and configured to fluidly communicate with the fluid channel 124 of the valve seat 102 when the valve seat 102 is received within the recess 112. The recess 112 is preferably substantially circular/cylindrical. The body 108 may comprise, for example, a gas conduit. It will be understood that the illustrated body 108, valve seat 102, and diaphragm 104 are not necessarily drawn to scale.

In one embodiment, the diaphragm 104 is formed of a nickel alloy, such as Elgiloy®, and the body 108 is formed of stainless steel. In one embodiment, the valve seat 102 is made to provide about 0.003 inches of deflection at 250° C. at a contact line with the diaphragm 104 when a valve closure force of 17 lbf is applied to the diaphragm (against the valve seat). This results in a maximum principal stress of about 5,786 psi (compressive) at the underside radius of the disk-shaped portion 118. In this embodiment, this stress value is below a calculated allowable fatigue stress limit of 7,000 psi.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while one variation of the invention has been shown and described in detail, other modifications, which are within the scope of this invention, will be readily apparent to those of skill in the art based upon this disclosure. It is also contemplated that various combinations or sub-combinations of the specific features and aspects of the embodiment may be made and still fall within the scope of the invention. Thus, it is intended that the scope of the present invention herein disclosed should not be limited by the particular disclosed embodiment described above, but should be determined only by a fair reading of the claims that follow.

What is claimed is:

1. A valve seat comprising a seat body defining a fluid orifice, the seat body being formed at least partially of polybenzimidazole, wherein the seat body comprises two cylindrical disk-shaped portions that sandwich a cylindrical central portion, the disk-shaped portions having a larger diameter and a smaller height than the central portion, the valve seat having a fluid channel extending through the disk-shaped portions and the central portion, the fluid orifice comprising an end of the fluid channel, wherein the disk-shaped portions are configured to flex to produce an improved seal when a convex surface of a diaphragm is pressed against the orifice.

2. A valve comprising the valve seat of claim 1, and a movable diaphragm having a bearing surface configured to bear against the fluid orifice to substantially block fluid flow through the orifice, the bearing surface being convex with respect to the orifice, the orifice being substantially circular.

3. A valve comprising the valve seat of claim 1, and a body element having a surface with a substantially circular recess sized to closely receive the seat body, the body element having a fluid passage extending to the recess and configured to fluidly communicate with the fluid channel of the seat body when the seat body is received within the recess.

* * * * *